US012347957B2

(12) United States Patent
Hsu et al.

(10) Patent No.: US 12,347,957 B2
(45) Date of Patent: Jul. 1, 2025

(54) ELECTRICAL CONNECTOR WITH IMPROVED CONTACTS

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Shuo-Hsiu Hsu, Phoenix, AZ (US); Tzu-Yao Hwang, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 394 days.

(21) Appl. No.: 17/894,042

(22) Filed: Aug. 23, 2022

(65) Prior Publication Data

US 2024/0072477 A1 Feb. 29, 2024

(51) Int. Cl.
  *H01R 13/24* (2006.01)
  *H01R 43/16* (2006.01)
  *H05K 7/10* (2006.01)

(52) U.S. Cl.
  CPC ..... *H01R 13/2442* (2013.01); *H01R 13/2492* (2013.01); *H05K 7/10* (2013.01); *H01R 43/16* (2013.01)

(58) Field of Classification Search
  CPC .............................. H01R 9/2491; H01R 43/16
  USPC ....... 439/626, 625, 629, 632, 638, 709, 720, 439/722, 723
  See application file for complete search history.

(56) References Cited

U.S. PATENT DOCUMENTS

| 7,074,055 B2* | 7/2006 | Yang ................... H01R 13/113 439/876 |
| 2004/0259394 A1 | 12/2004 | Chiang |
| 2009/0047817 A1* | 2/2009 | Liu .................... H01R 13/2492 439/296 |
| 2010/0297866 A1* | 11/2010 | Ju ....................... H01R 13/2485 439/342 |
| 2017/0271801 A1 | 9/2017 | Liao |
| 2019/0103687 A1* | 4/2019 | Murtagian ......... H01R 13/6474 |
| 2019/0190207 A1* | 6/2019 | Ju .......................... H01R 12/57 |
| 2019/0334272 A1 | 10/2019 | Hsu |
| 2021/0203098 A1 | 7/2021 | Hsu |

FOREIGN PATENT DOCUMENTS

| CN | 111029819 A | 4/2020 |
| CN | 114188746 A | 3/2022 |

\* cited by examiner

*Primary Examiner* — Abdullah A Riyami
*Assistant Examiner* — Amara Anderson
(74) *Attorney, Agent, or Firm* — Ming Chieh Chang

(57) ABSTRACT

An electrical connector includes: an insulative housing defining an upper face and a lower face and having plural passageways running through the upper and lower faces; and plural contacts secured in the plural passageways of the insulative housing. Each of the plural contacts includes a base part, an upper arm extending from the base part, and a first part and a second part bent from opposite sides of the base part, a first limb bent from the first part and a second limb bent from the second part. The first limb and the second limb are located staggered in an upper and lower direction, and the base part, the first and second parts, and the first and second limbs together form a tubular structure.

9 Claims, 10 Drawing Sheets

ELECTRICAL CONNECTOR WITH IMPROVED CONTACTS

BACKGROUND OF THE INVENTION

Field of the Invention

The present invention relates to an electrical connector, especially to a chip socket for receiving a chip module, such as CPU.

Description of Related Arts

Contacts for electrical connectors have given thickness and are usually made by stamping and forming planar contact stocks. Tubular contacts are preferred for increased coupling and decreased impedance in high-frequency applications as well as for better shielding effects. However, it is difficult and complicated to make contacts into desired tubular shapes by stamping and forming.

SUMMARY OF THE INVENTION

An electrical connector comprising: an insulative housing defining an upper face and a lower face and having a plurality of passageways running though the upper and lower face; and a plurality of contacts secured in the plurality of passageways of the insulative housing, each of the plurality of contacts comprising a base part, an upper arm extending from the base part, and a first part and a second part bent from opposite sides of the base part, a first limb bent from the first part and a second limb bent from the second part; wherein the first limb and the second limb are located staggered in an upper and lower direction, thereby the base part, the first and second part and the first and second limbs together form a tubular structure.

DETAILED DESCRIPTION OF THE DRAWINGS

Figure 1:
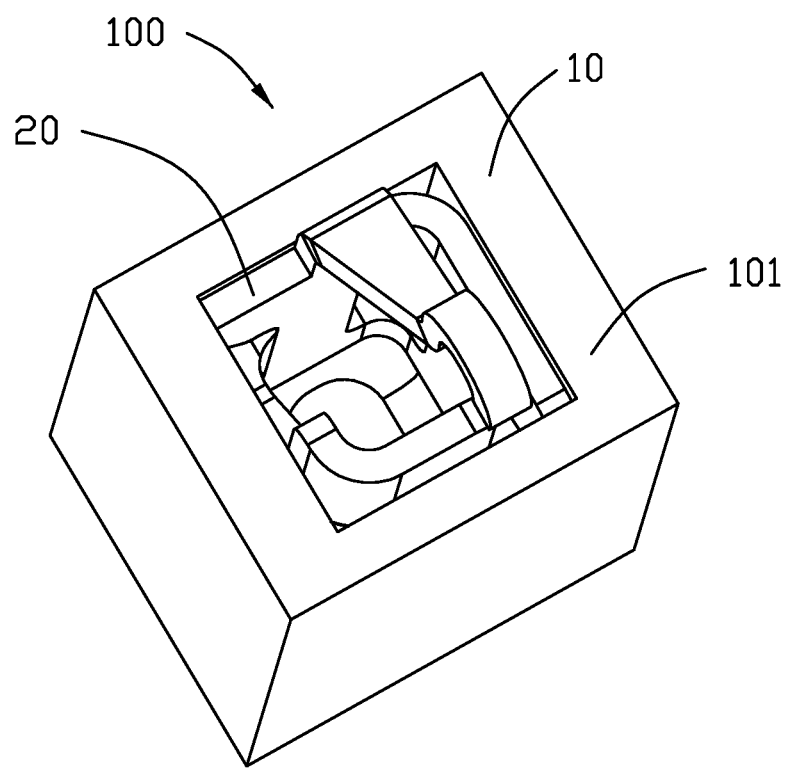
FIG. 1 is a perspective view of an electrical connector of a first embodiment in accordance with the present invention.
Figure 2:
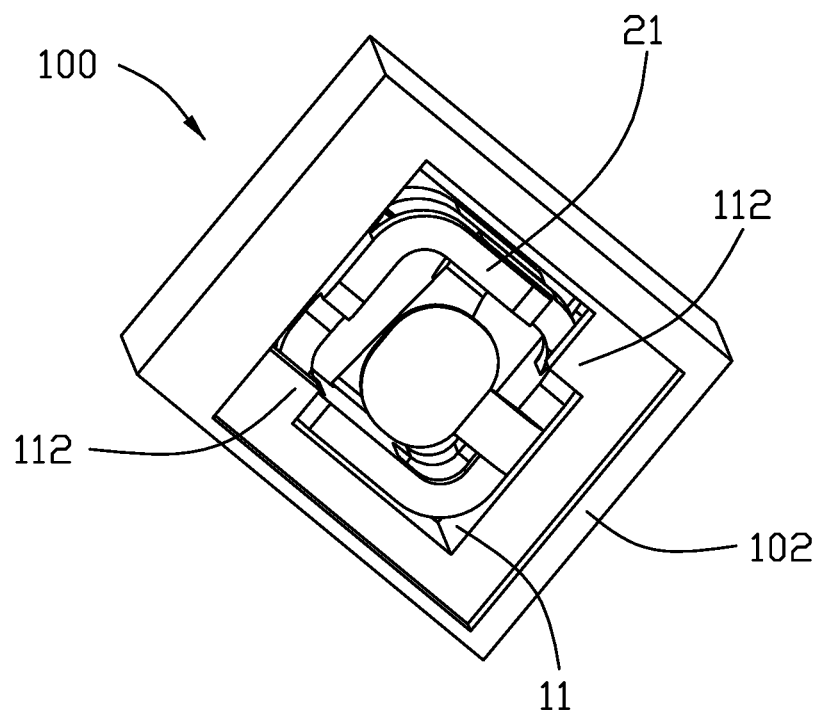
FIG. 2 is another perspective view of the electrical connector in FIG. 1.
Figure 3:
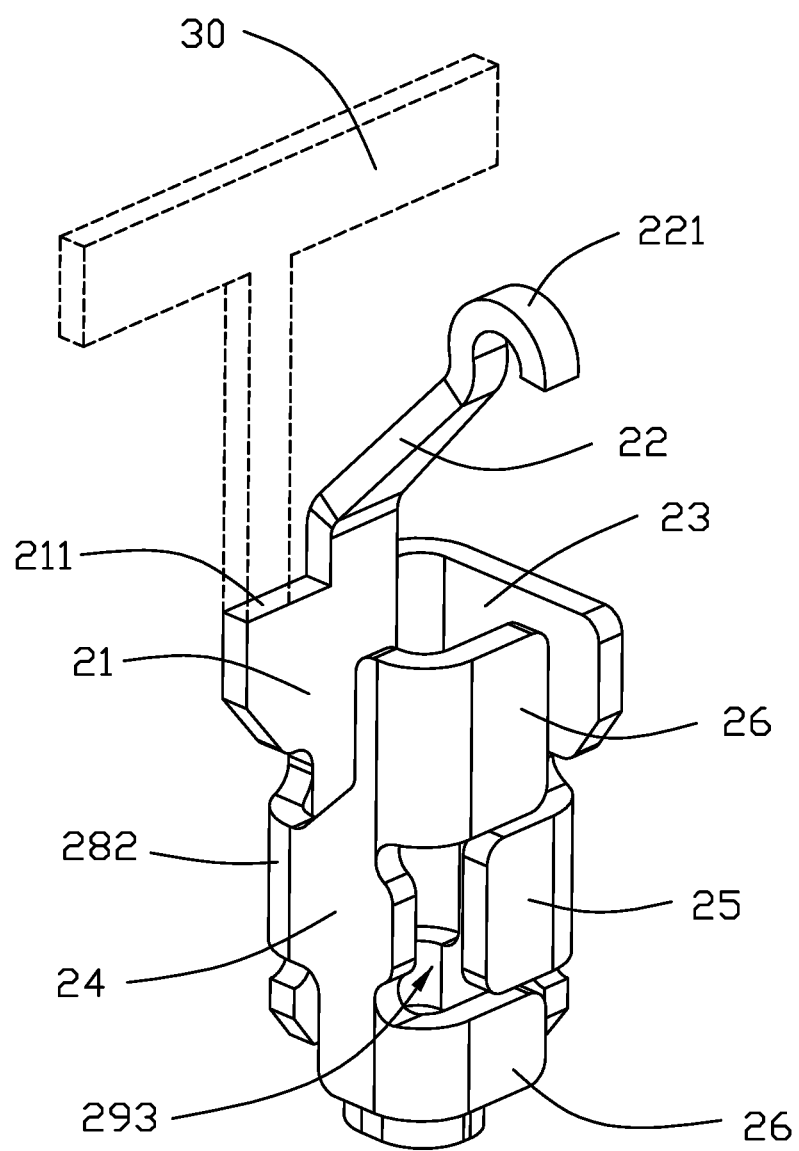
FIG. 3 is a perspective view of a contact in the electrical connector in FIG. 1, wherein a strip is connecting with the contacts.
Figure 4:
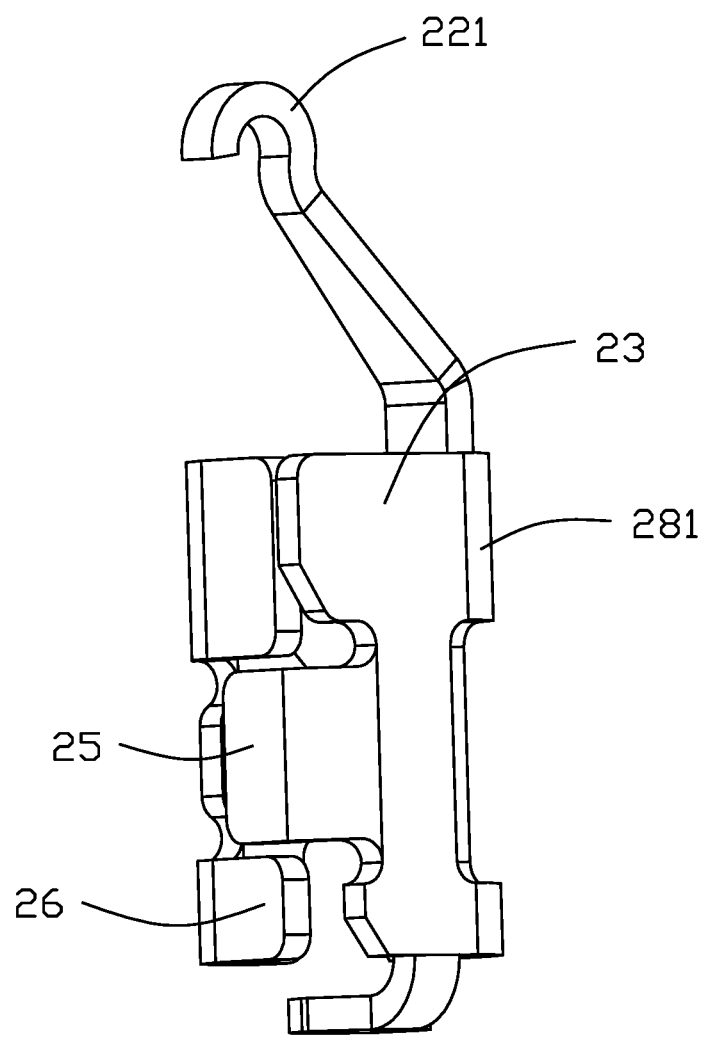
FIG. 4 is another exploded view of the contact in FIG. 3.
Figure 5:
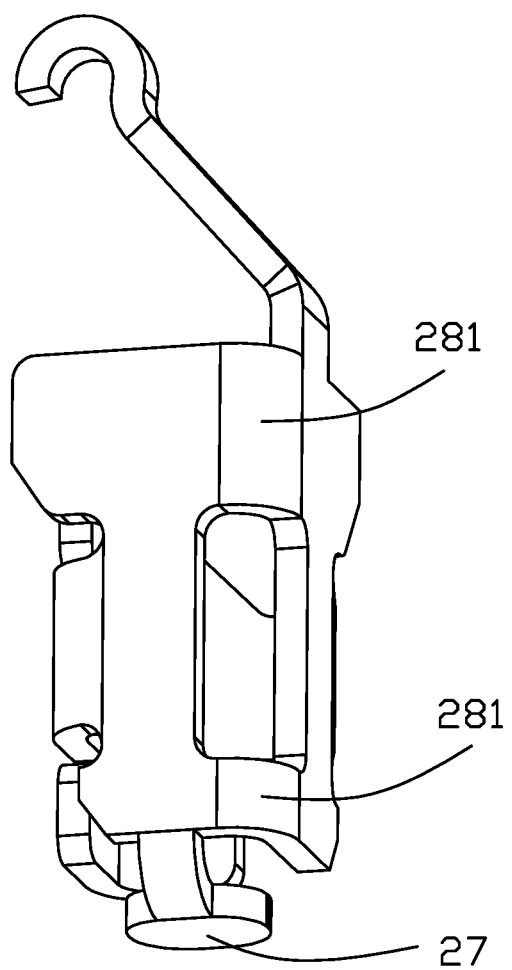
FIG. 5 is another exploded view of the contact in FIG. 3.

Referring to FIGS. 1-7, an electrical connector 100 of a first embodiment is a chip socket, which comprises a housing 10 made from insulating material and a plurality of contacts 20 in a matric pattern. The housing 10 defines an upper face 101 and a lower face 102 and has a plurality of passageways 11 running through the upper face 101 and the lower face 102. The contacts 20 are secured in the plurality of passageways 11 of the housing 10. Each of the plurality of contacts 20 has a base part 21 and an upper arm 22 extending from the base part 21 with a contacting portion 221. The insulating housing 10 shown depicts only schematically a part of an overall housing structure that may have hundreds of passageways arranged in rows and columns, as is well known in this art, e.g., a CPU socket connector housing.

Further, the contact 20 includes a first part 23 and a second part 24 bent from opposite sides of the base part 21, a first limb 25 bent from the first part 23 and a second limb 26 bent from the second part 24. The first limb 25 and the second limb 26 are located staggered in an upper and lower direction of the electrical connector, thereby the base part 21, the first and second parts 23, 24 and the first and second limbs 25, 26 together form a tubular structure. The contact 20 is secured in the passageway 11 by the base part 21 and the first part 23. The base part 21 defines a strip connecting upper face 211 proximately to the upper arm 22. The strip connecting upper face 211 is formed after the contact 10 is secured in the passageway 11 and the strip 30 is cut away.

Two second limbs 26 extend from the second part 24 and separate from each other with a space 293 in the upper and lower direction, the first limb 25 is located in the space 293. As best shown, the tuber structure is of a square shape, and the first and second limbs 25, 26 commonly construct a side wall of the square tuber structure.

Figure 6:
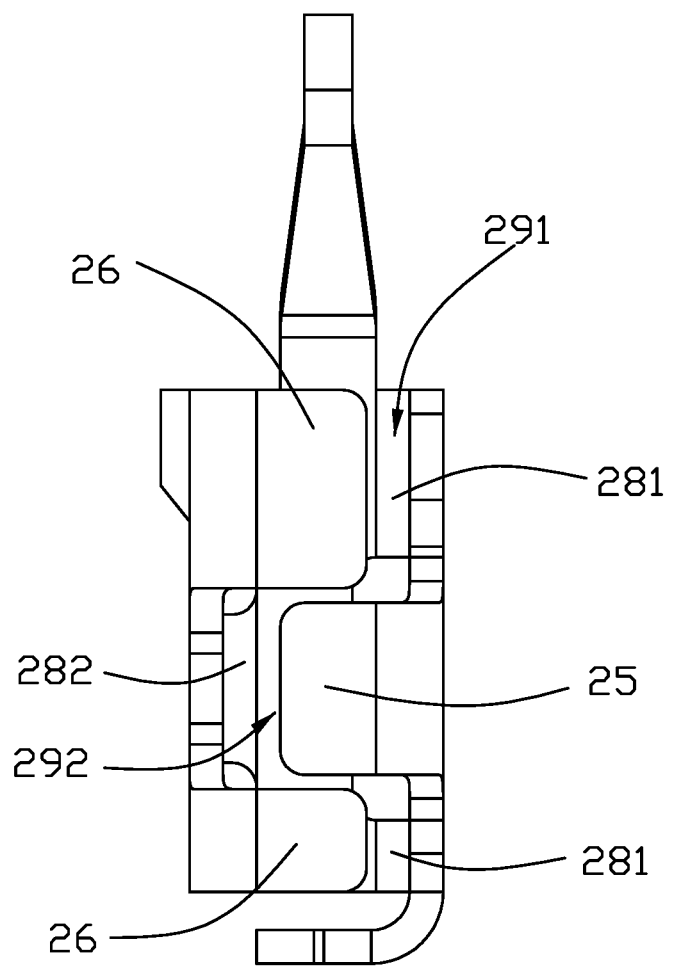
FIG. 6 is a front elevational view of the contact in FIG. 3.
Figure 7:
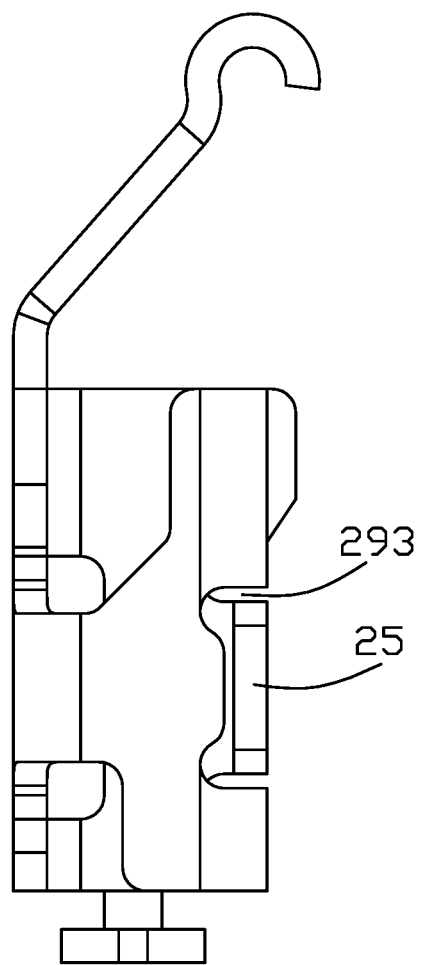
FIG. 7 is a side planner view of the contact in FIG. 3.

As best shown in FIGS. 6-7, two first bending portions 281 jointed with the base part 21 and the first part 23, are located at opposite sides of the first limb 25 in the upper and lower direction as viewed from a first direction perpendicular to the base part (as shown in FIG. 6), the two second limbs 26 separate from the first part 25 with a gap 291 as viewed from the first direction. A second bending portion 282 joined with the base part 21 and the second part 24, are located between the two second limbs 26 in the upper and lower direction as viewed in the first direction, and the first limb 25 separate from the second part 24 with a gap 292 as view from the first direction. That means, the first bending portion 281 and the second bending portion 282 are visible as viewed from the first direction. During a manufacturing process, tools pass through the first gap 291 and the second gap 292 and fitly press against the first and second bending portions 281, 282, then the first and second part 23, 24 can be formed by bending.

Figure 8:
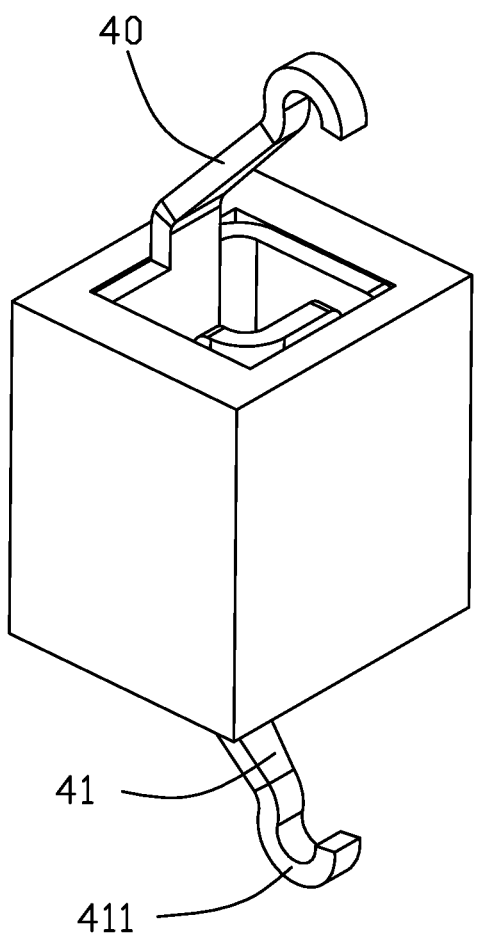
FIG. 8 is a perspective view of an electrical connector of a second embodiment in accordance with the present invention.
Figure 9:
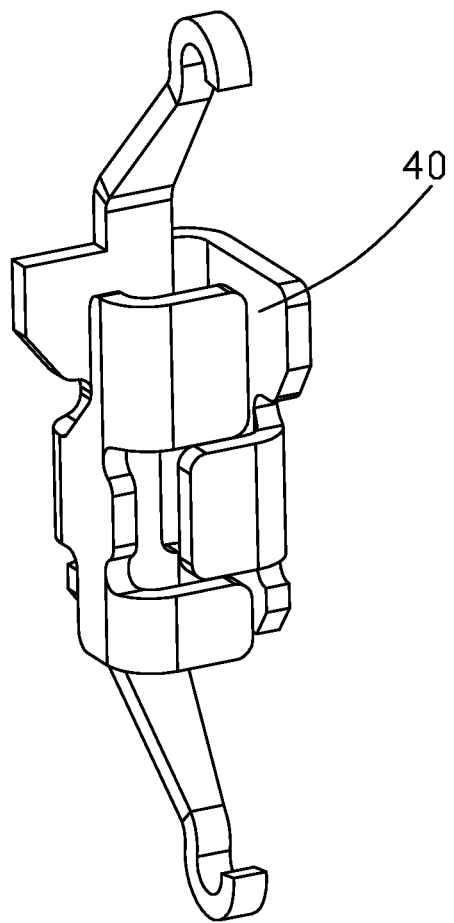
FIG. 9 is a perspective view of a contact in the electrical connector in FIG. 8.
Figure 10:
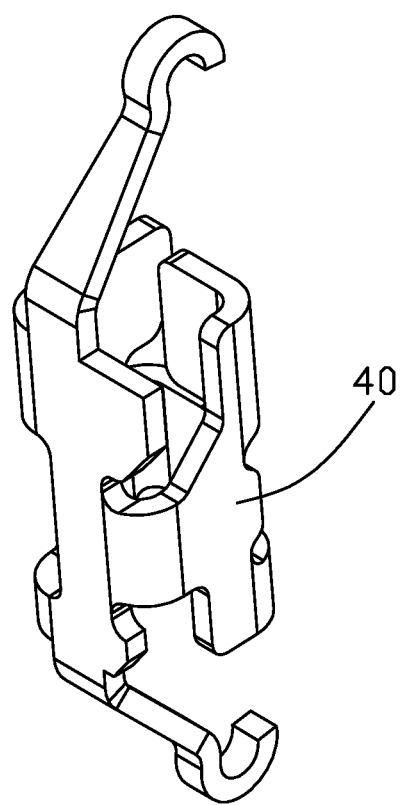
FIG. 10 is another exploded view of the contact in FIG. 9.

The passageway 11 defines two protruding portions 112 at opposite corners thereof, and the contact 20 is supported by the protruding portions 112. The lower leg 27 extends from the base part 21 and has a soldering plate to be soldered with a solder ball. FIGS. 8-10 show that the contact 40 has a lower arm 41 with a contacting portion 411, and other features are same to the contact 20.

However, the disclosure is illustrative only, changes may be made in detail, especially in matter of shape, size, and arrangement of parts within the principles of the invention.

The invention claimed is:

1. An electrical connector comprising:
an insulative housing defining an upper face and a lower face and having a plurality of passageways running through the upper and lower faces; and
a plurality of contacts secured in the plurality of passageways of the insulative housing, each of the plurality of contacts comprising a base part, an upper arm extending from the base part, and a first part and a second part bent from opposite sides of the base part, a first limb bent from the first part and a second limb bent from the second part;

wherein the first limb and the second limb are located staggered in an upper and lower direction, and the base part, the first and second parts, and the first and second limbs together form a tubular structure; and wherein two second limbs extend from the second part and are separated from each other with a space in the upper and lower direction, and the first limb is located in the space.

2. The electrical connector as claimed in claim 1, wherein the base part defines a strip connecting upper face proximate to the upper arm.

3. The electrical connector as claimed in claim 1, wherein the contact is secured in the passageway by the base part and the first part thereof.

4. The electrical connector as claimed in claim 1, wherein a lower leg extends from the base part or the first part.

5. The electrical connector as claimed in claim 1, wherein two first bending portions joined with the base part and the first part are located at opposite sides of the first limb in the upper and lower direction as viewed from a first direction perpendicular to the base part, and the two second limbs are separated from the first part with a first gap as viewed from the first direction.

6. The electrical connector as claimed in claim 5, wherein a second bending portion joined with the base part and the second part is located between the two second limbs in the upper and lower direction as viewed in the first direction, and the first limb is separated from the second part with a second gap as viewed from the first direction.

7. An electrical connector comprising:
a housing defining at least one passageway; and
a contact secured in the passageway of the housing, the contact comprising a square tuber, and an upper arm and a lower leg extending from the square tuber;
the square tuber comprising an upright base part, a first part bent from a side of the base part with a first bending portion, a second part bent from another side of the base part with a second bending portion, a first limb bent from the first part and a second limb bent from the second part;

wherein the first limb and the second limb are located staggered in an upper and lower direction of the housing, and the first bending portion and the second bending portion are visible as viewed from a first direction perpendicular to the base part; and wherein two second limbs bend from the second part and are separated from each other along the upper and lower direction with a space into which the first limb extends.

8. An electrical connector comprising:
a housing defining a plurality of passageways; and
a plurality of contacts secured in the plurality of passageways of the housing, each contact comprising a square tuber, and an upper arm and a lower leg extending from the square tuber;
the square tuber comprising an upright base part, a first part and a second part bent from opposite sides of the base part, a first limb bent from the first part and a second limb bent from the second part;
wherein the first limb and the second limb commonly construct a side of the square tuber and are opposite and parallel to the upright base part; and
wherein two second limbs bend from the second part and are separate from each other along an upright direction with a space into which the first limb extends.

9. The electrical connector as claimed in claim 8, wherein the passageway defines two protruding portions at opposite corners thereof, and the contact is supported by the protruding portions.

* * * * *